(12) United States Patent  (10) Patent No.: US 8,258,840 B2
Yoon  (45) Date of Patent: Sep. 4, 2012

(54) DELAY LOCKED LOOP AND INTEGRATED CIRCUIT INCLUDING THE SAME

(75) Inventor: Sang-Sic Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/980,880

(22) Filed: Dec. 29, 2010

(65) Prior Publication Data

US 2012/0105118 A1  May 3, 2012

(30) Foreign Application Priority Data

Oct. 27, 2010 (KR) .......................... 10-2010-0105440

(51) Int. Cl.
*H03L 7/06* (2006.01)
(52) U.S. Cl. ....................................... 327/158; 327/149
(58) Field of Classification Search .................. None
See application file for complete search history.

(56) References Cited

U.S. PATENT DOCUMENTS 5,796,673 A * 8/1998 Foss et al. ................. 365/233.1
2010/0213991 A1* 8/2010 Fukuda ........................ 327/117

FOREIGN PATENT DOCUMENTS

KR 1020030056461 7/2003
KR 1020100045186 5/2010

* cited by examiner

*Primary Examiner* — Cassandra Cox
(74) *Attorney, Agent, or Firm* — IP & T Group LLP

(57) ABSTRACT

A delay locked loop includes a first delay unit configured to output an output clock by delaying an input clock by a delay; a replica delay unit configured to output a feedback clock by delaying the output clock with a delay equal to a sum of a first delay amount for a first operational frequency of the delayed locked loop and an additional delay amount for a second operational frequency of the delayed locked loop, wherein the second operational frequency is lower than the first operational frequency; and a delay amount control unit configured to control the delay of the first delay unit by comparing a phase of the input clock with a phase of the feedback clock.

20 Claims, 7 Drawing Sheets tCK=A+D1+D2 tCK=A+B+D1+D2 tCK=A+D1+D2+Y

US 8,258,840 B2

DELAY LOCKED LOOP AND INTEGRATED CIRCUIT INCLUDING THE SAME

CROSS-REFERENCE TO RELATED APPLICATIONS

The present application claims priority of Korean Patent Application No. 10-2010-0105440, filed on Oct. 27, 2010, which is incorporated herein by reference in its entirety.

BACKGROUND OF THE INVENTION

Exemplary embodiments of the present invention relate to a semiconductor design technology, and more particularly, to a delay locked loop and an integrated circuit including the same.

In general, circuit elements such as a double data rate synchronous dynamic random access memory (DDR SDRAM) are designed to transfer data and various signals to external devices by using an internal clock synchronized with an external clock used in an external system. Here, the internal clock is synchronized with the external clock when it is initially applied to the circuit elements, but the internal clock may be delayed while passing through various elements included in the circuit elements. As a result, the internal clock is often not synchronized with the external clock when finally outputted to external devices.

In order to stably transfer the data and the various signals output from the circuit elements, the internal clock, which is delayed while passing through elements of the memory device, is to be synchronized so as to match an edge or center of the external clock applied from the external devices. More specifically, the internal clock may be synchronized with the external clock by compensating time for loading data on a bus. Examples of a clock synchronization circuit for performing the compensation of the data load time include a delay locked loop (DLL) circuit.

FIG. 1 is a block diagram of an integrated circuit including a conventional DLL.

Referring to FIG. 1, the conventional DLL includes a delay unit 101, a delay amount control unit 103, and a replica delay 105. Here, an integrated circuit comprises the conventional DLL, and first and second clock paths 107 and 109. The integrated circuit may be a single chip performing a preset function within a system, such as a dynamic random access memory (DRAM), or an entire circuit comprising a plurality of chips. In FIG. 1, each block has a delay amount when a clock passes through the component, where the delay amount is indicated by a label within a parenthesis.

The first clock path 107 is a clock path where an external clock EXTCLK, which is inputted from outside of the integrated circuit, is transmitted as an input clock INCLK of the DLL.

The second clock path 109 is a clock path where an output clock OUTCLK of the DLL is transmitted as a target clock TGCLK, which may be used in a target circuit of a system. For example, when the system is a DRAM, the target circuit may be a data pad DQ, and the target clock TGCLK may be a data strobe signal DQS for the DQ pad. In such a case, the second clock path 109 becomes a clock path where the output clock OUTCLK of the DLL is transmitted as the data strobe signal DQS to outside of the DRAM.

The delay unit 101 outputs the output clock OUTCLK by delaying the input clock INCLK by a delay amount (A).

The replica delay unit 105 outputs a feedback clock FBCLK by reflecting/applying a modeled delay amount (D1+D2) in/to the output clock OUTCLK outputted from the delay unit 101. The modeled delay amount (D1+D2) is generated by modeling a combined delay amount of a first delay amount (D1) of the first clock path 107 and a second delay amount (D2) of the second clock path 109.

The delay amount control unit 103 controls the delay amount (A) of the delay unit 101 by detecting a phase difference between the input clock INCLK and the feedback clock FBCLK.

FIG. 2 is a clock timing diagram illustrating an operation of the DLL of FIG. 1.

Referring to FIG. 2, the delay amount control unit 103 controls the delay amount (A) of the delay unit 101 to be the difference between the modeled delay amount (D1+D2) of the replica delay unit 105 and a period tCK of the input clock INCLK. Thus, a phase of the input clock INCLK may be synchronized with the phase of the feedback clock FBCLK by controlling the delay amount (A) of the delay unit 101 to be tCK−(D1+D2).

When a frequency of the input clock INCLK is higher, the modeled delay amount (D1+D2) of the replica delay unit 105 becomes greater than the period tCK of the input clock INCLK. In this case, the delay amount control unit 103 may control the input clock INCLK to be synchronized with the feedback clock FBCLK for the phase of the input clock INCLK received after lapse of several periods of the input clock as received by the delay unit 101. Accordingly, the delay amount control unit 103 controls the delay amount (A) of the delay unit 101 to equal a difference between the modeled delay amount (D1+D2) of the replica delay unit 105 and a time equal to a multiple periods tCKs of the input clock INCLK, i.e., N*tCK−(D1+D2), N being a positive integer number.

FIG. 3 is a block diagram of an integrated circuit including a conventional DLL that illustrates a method for increasing a delay amount during a low frequency operation, and FIG. 4 is a clock timing diagram illustrating the low frequency operation of the DLL of FIG. 3.

As a frequency of the input clock INCLK becomes lower, the period tCK of the input clock INCLK becomes longer. When the period tCK is longer than the modeled delay amount (D1+D2) of the replica delay unit 105 and the maximum delay amount (A) of the delay unit 101, the delay unit 101 must have an increased delay amount (B) in addition to the delay amount (A). As a result, the delay unit 101 has a delay amount (A+B) as shown in FIGS. 3 and 4.

Here, the delay unit 101 of the conventional DLL is often composed of a plurality of delay cells, each having an extremely fine unit delay amount. When the delay amount of the delay unit 101 is to be increased for a low frequency operation, an accompanying area of semiconductor circuit also increases. Also, current consumption increases and cause jitters since a clock path of the DLL becomes longer.

SUMMARY OF THE INVENTION

Exemplary embodiments of the present invention are directed to a delay locked loop and an integrated circuit including the same which are capable of extending a range of an operational frequency without increase of area and current consumption.

In accordance with an exemplary embodiment of the present invention, a delay locked loop includes a first delay unit configured to output an output clock by delaying an input clock by a delay; a replica delay unit configured to output a feedback clock by delaying the output clock with a delay equal to a sum of a first delay amount for a first operational frequency of the delayed locked loop and an additional delay amount for a second operational frequency of the delayed locked loop, wherein the second operational frequency is lower than the first operational frequency; and a delay amount control unit configured to control the delay of the first delay unit by comparing a phase of the input clock with a phase of the feedback clock.

In accordance with another exemplary embodiment of the present invention, an integrated circuit includes a first clock path configured to output an input clock; a first delay unit configured to output an output clock by delaying the input clock by a delay; a replica delay unit configured to output a feedback clock by delaying the output clock with a delay equal to a sum of a first delay amount during a first operational frequency of the integrated circuit and an additional delay amount during a second operational frequency of the integrated circuit, wherein the second operational frequency is lower than the first operational frequency; a delay amount control unit configured to control the delay of the first delay unit by comparing a phase of the input clock with a phase of the feedback clock; and a second clock path configured to transfer the output clock as a target clock used in a target circuit of the integrated circuit, wherein the first and second clock paths are configured to increase a sum of delays of the first and second clock paths by the additional delay amount during the second frequency operation.

DESCRIPTION OF SPECIFIC EMBODIMENTS

Figure 1:
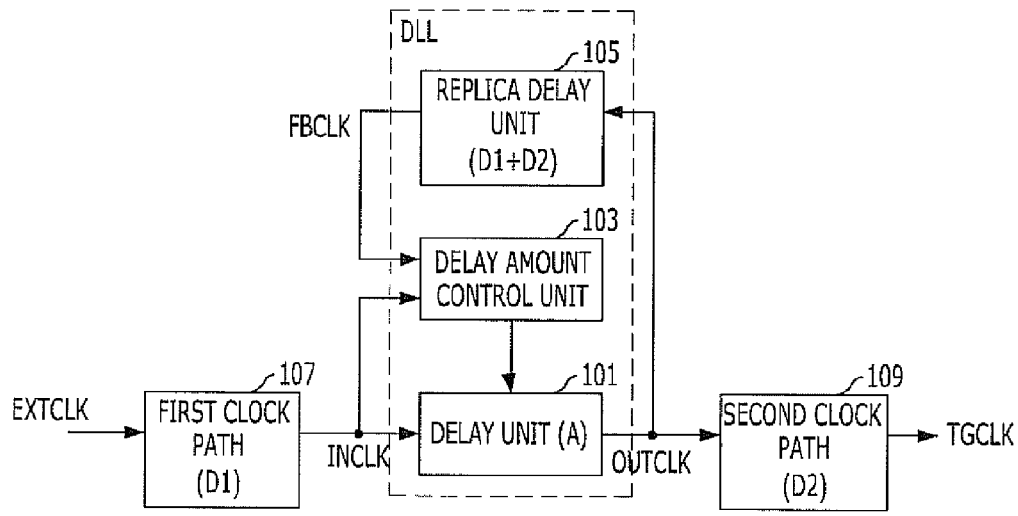
FIG. 1 is a block diagram of an integrated circuit including a conventional DLL.
Figure 2:
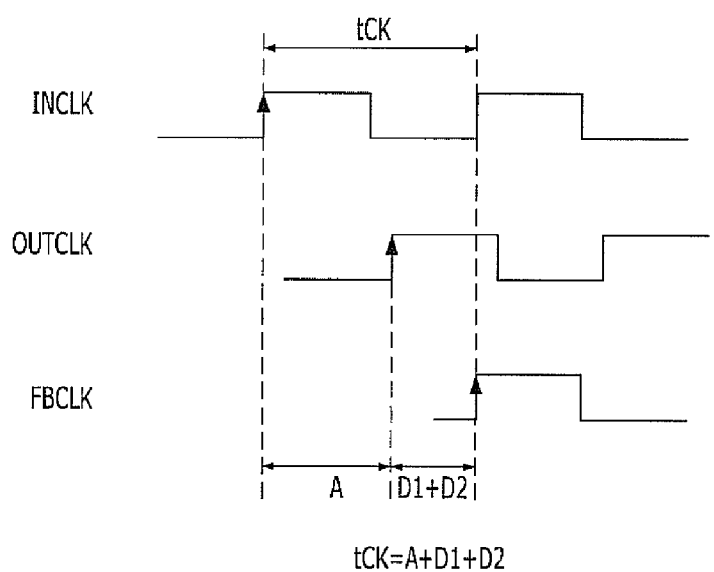
FIG. 2 is a clock timing diagram illustrating an operation of the DLL of FIG. 1.
Figure 3:
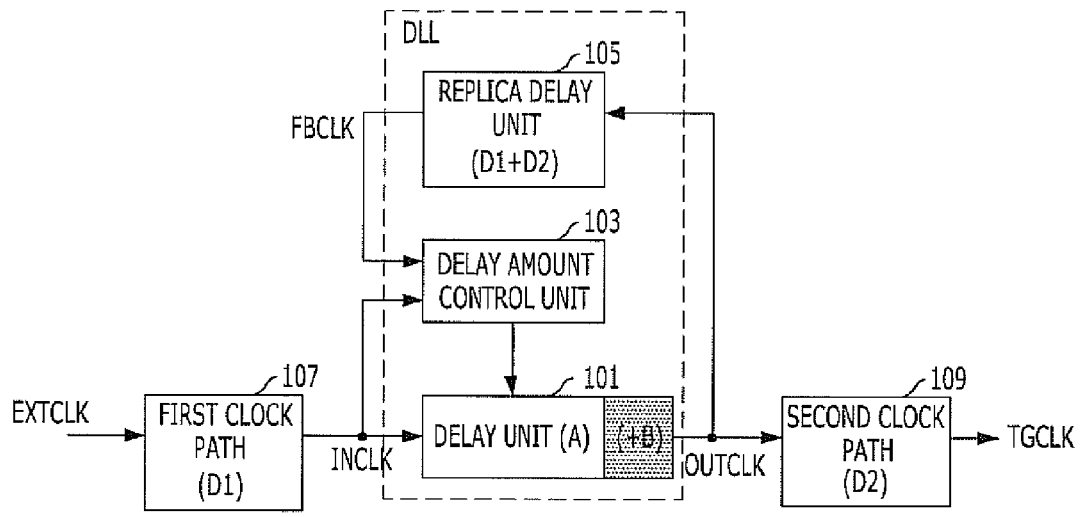
FIG. 3 is a block diagram of an integrated circuit including a conventional DLL that illustrates a method for increasing a delay amount during a low frequency operation.
Figure 4:
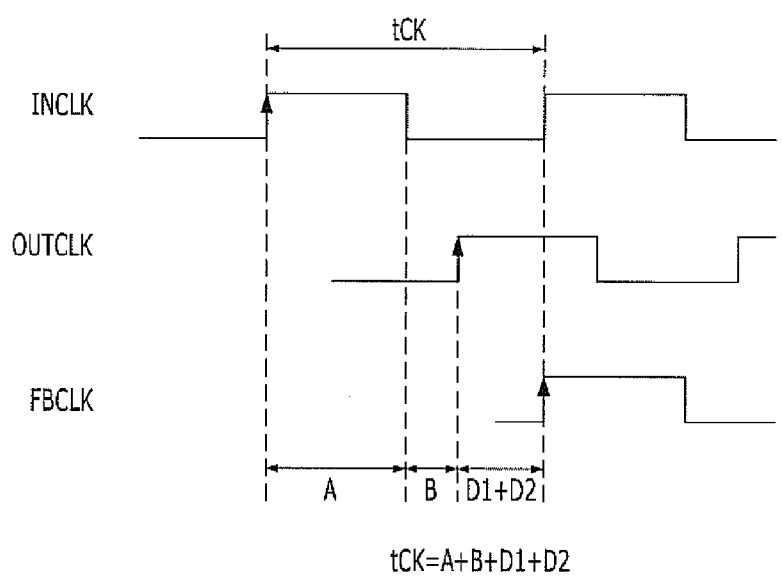
FIG. 4 is a clock timing diagram illustrating the low frequency operation of the DLL of FIG. 3.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 5A:
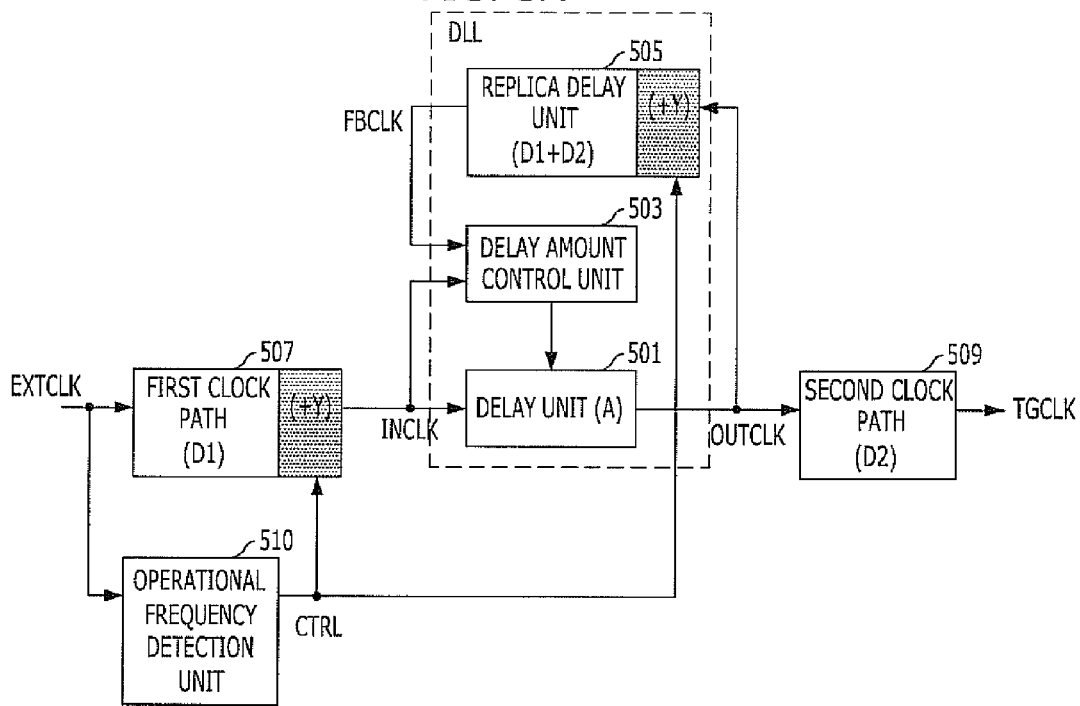
FIG. 5A is a block diagram of an integrated circuit including a DLL in accordance with an embodiment of the present invention.

FIG. 5A is a block diagram of an integrated circuit including a DLL in accordance with an embodiment of the present invention.

In FIG. 5A, a delay amount, which is used during a low frequency operation, is represented by a shadow-marked block. Here, the integrated circuit denotes a single chip performing a preset function within a system.

Referring to FIG. 5A, the DLL in accordance with the embodiment includes a delay unit 501, a delay amount control unit 503, and a replica delay 505. Further, the integrated circuit comprises the DLL, first and second clock paths 507 and 509, and an operational frequency detection unit 510. In FIG. 5A, each block has a delay amount for a clock passing through the component as indicated by the corresponding label within a parenthesis.

The delay unit 501 outputs an output clock OUTCLK by delaying an input clock INCLK by a delay amount (A).

The replica delay unit 505 outputs a feedback clock FBCLK by delaying the output clock OUTCLK by a delay amount (D1+D2) during a high frequency operation, and by further delaying the output clock OUTCLK by an additional delay amount (Y) during a low frequency operation. The delay amount (D1+D2) is generated by modeling a delay amount including a first delay amount (D1) of the first clock path 507 and a second delay amount (D2) of the second clock path 509.

The delay amount control unit 503 controls the delay amount (A) of the delay unit 501 by comparing a phase of the input clock INCLK with a phase of the feedback clock FBCLK.

The first clock path 507 transfers an external clock EXTCLK, which is inputted from outside of the integrated circuit, as the input clock INCLK of the DLL. The second clock path 509 transfers the output clock OUTCLK of the DLL as a target clock TGCLK, which may be used in a target circuit of a system (not shown).

The operational frequency detection unit 510 detects an operational frequency of the external clock EXTCLK, which is inputted from outside of the integrated circuit, and generates a control signal CTRL for determining the additional delay amount (Y) of the replica delay unit 505 and the first clock path 507.

As described above, an exemplary embodiment of the present invention increases delay amounts of the replica delay unit 505 and the first clock path 507. According to an example, the delay amount of the delay unit 501 is not additionally increased beyond the maximum delay amount of the delay unit 501 by adding additional delay cells. That is, the first clock path 507 outputs the input clock INCLK by delaying the external clock EXTCLK by the additional delay amount (Y) in addition to the first delay amount (D1), and the replica delay unit 505 outputs the feedback clock FBCLK by delaying the output clock OUTCLK by the additional delay amount (Y) in addition to the delay amount (D1+D2). According to an example, the first clock path 507 may include an input buffer of the DLL.

Meanwhile, the delay unit 501 may include a plurality of delay cells, each having a relatively fine unit delay amount for finely controlling a delay amount during the high frequency operation. Here, since the integrated circuit of the embodiment increases a delay amount by using the replica delay unit 505 and the first clock path 507, resistors and capacitors of the integrated circuit may be optimized to have a desired delay amount according to a range of an operational frequency. Thus, the integrated circuit may be implemented with a relatively small area with a delay amount that can be selected to be large, and thus the integrated circuit may reduce jitters caused by an increase of the delay cells included in the delay unit 501.

The operational frequency detection unit 510 determines the range of the operational frequency by comparing a frequency of the external clock EXTCLK with a reference frequency, and outputs the control signal CTRL to the replica delay unit 505 and the first clock path 507. Specifically, when the frequency of the external clock EXTCLK is higher than the reference frequency, the operational frequency detection unit 510 outputs the control signal CTRL having a logic high level. On the other hand, when the frequency of the external clock EXTCLK is lower than the reference frequency, the operational frequency detection unit 510 outputs the control signal CTRL having a logic low level. According to an example, the operational frequency detection unit 510 may alternatively use the input clock INCLK or the output clock OUTCLK to determine the range of the operational frequency since all three clocks have the same clock frequency. Further, the operational frequency detection unit 510 may detect three or more different ranges of the operational frequency and output the control signal CTRL to indicate which one of the ranges that the operation frequency falls, to thereby enable adjusting the additional delay amount (Y) of the replica delay unit 505 and the first clock path 507 for the appropriate range. Thus, the range of the operational frequency may be extended by use of the control signal and an appropriate adjustment of delay amounts of the replica delay unit 505 and the first clock path 507 may be obtained.

Figure 5B:
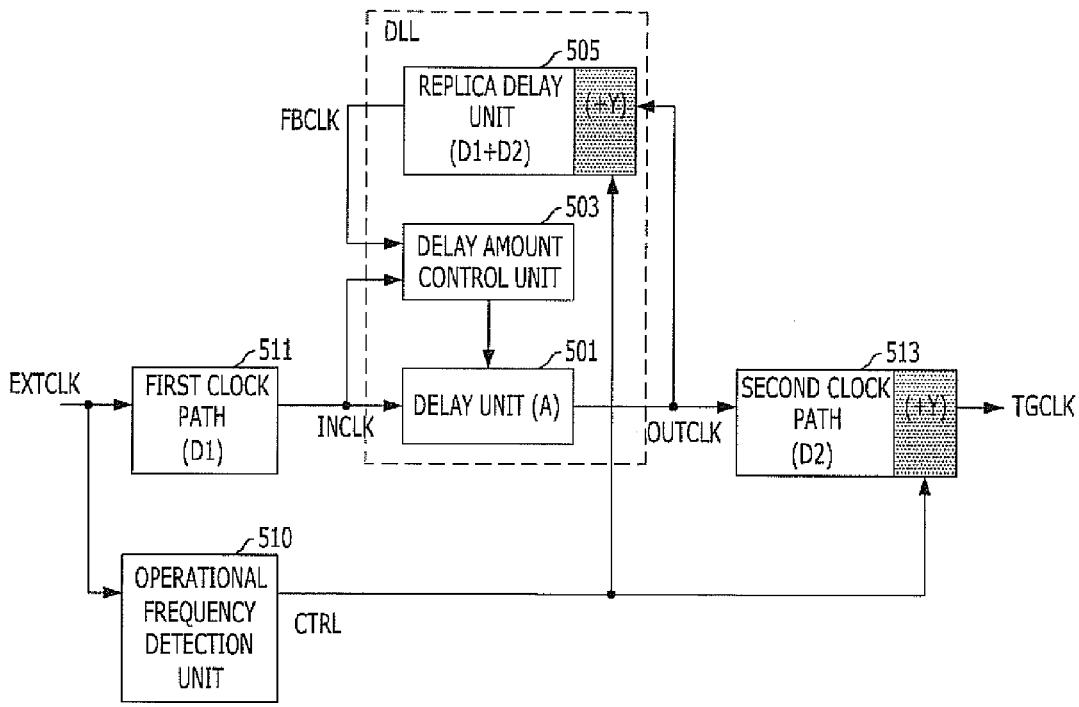
FIG. 5B is a block diagram of an integrated circuit including a DLL in accordance with another embodiment of the present invention.

FIG. 5B is a block diagram of an integrated circuit including a DLL in accordance with another embodiment of the present invention. In FIGS. 5A and 5B, like reference numerals are used to refer to like elements.

Referring to FIG. 5B, the DLL in accordance with another embodiment includes a delay unit 501, a delay amount control unit 503, and a replica delay 505. Further, the integrated circuit comprises the DLL, first and second clock paths 511 and 513, and an operational frequency detection unit 510. In FIG. 5B, the operation of each component included in the integrated circuit are substantially the same as those of FIG. 5A except that a delay amount of the second clock path 513 is increased by an additional delay amount (Y) instead of the first clock path 511. Here, the second clock path 513 is a clock path where an output clock OUTCLK of the DLL is transmitted as a target clock TGCLK, where the target clock TGCLK may be used in a target circuit of a system (not shown). For example, when the system is a DRAM, the target circuit may be a data pad DQ, and the target clock TGCLK may be a data strobe signal DQS used for the DQ pad. In such a case, the second clock path 513 becomes a clock path where the output clock OUTCLK of the DLL is transmitted to outside of the DRAM as the data strobe signal DQS.

Figure 6:
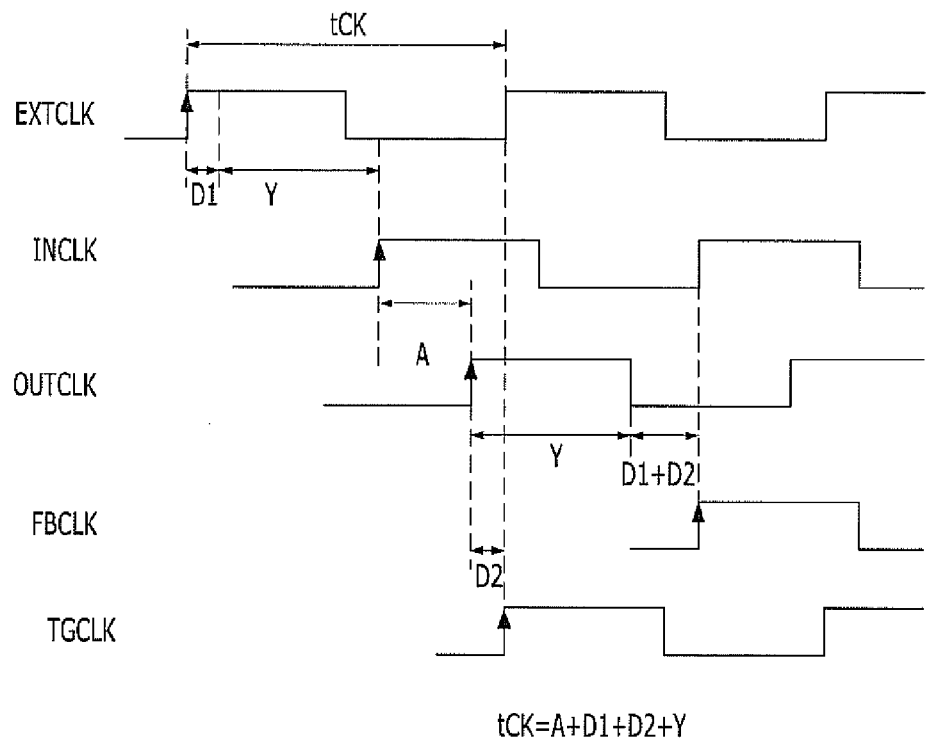
FIG. 6 is a clock timing diagram illustrating a low frequency operation of the DLL of FIG. 5A.

FIG. 6 is a clock timing diagram illustrating a low frequency operation of the DLL of FIG. 5A. According to an example, the DLL is assumed to be used in a DRAM.

The first clock path 507 transfers the external clock EXTCLK as the input clock INCLK of the DLL. Here, the input clock INCLK is delayed by a delay amount including the first delay amount (D1) and the additional delay amount (Y) which corresponds to the low frequency operation of the DLL. The delay unit 501 further delays the input clock INCLK by the delay amount (A), and output the delayed input clock as the output clock OUTCLK of the DLL.

The replica delay unit 505 delays the output clock OUTCLK by a sum of the delay amount (D1+D2) and the additional delay amount (Y), and output the delayed output clock as the feedback clock FBCLK. At the same time, the second clock path 509 transfers the output clock OUTCLK as the data strobe signal DQS through the data pad DQ. Here, the data strobe signal DQS is outputted by delaying the output clock OUTCLK by the second delay amount (D2).

At this time, the delay amount control unit 503 controls the delay amount (A) of the delay unit 501 by synchronizing the phase of the input clock INCLK with the phase of the feedback clock FBCLK. Accordingly, the data strobe signal DQS outputted outside the DRAM (that is, OUTCLK) has substantially the same phase as the external clock EXTCLK, and thus, data, which are outputted in response to the data strobe signal DQS, also have substantially the same phase as the external clock EXTCLK.

Figure 7:
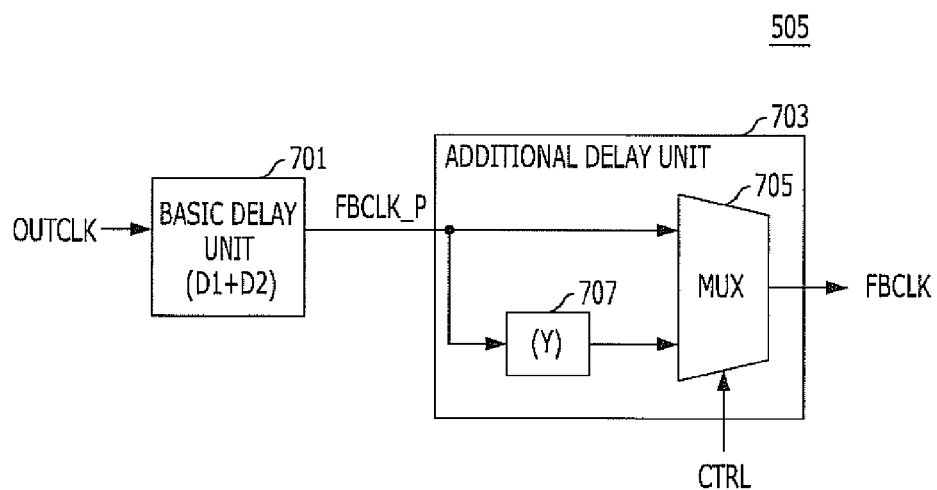
FIG. 7 is a detailed block diagram of a replica delay unit of FIG. 5A in accordance with an embodiment of the present invention.

FIG. 7 is a detailed block diagram of the replica delay unit 505 of FIG. 5A in accordance with an embodiment of the present invention.

Referring to FIG. 7, the replica delay unit 505 comprises a basic delay unit 701 and an additional delay unit 703.

The delay unit 701 delays the output clock OUTCLK by the delay amount (D1+D2) to output a preliminary feedback clock FBCLK_P, regardless of the operational frequency of the external clock EXTCLK. The additional delay unit 703 delays the preliminary feedback clock FBCLK_P in response to the control signal CTRL and outputs the feedback clock FBCLK.

The additional delay unit 703 comprises a delay cell 707 and a multiplexer 705. The delay cell 707 delays the preliminary feedback clock FBCLK_P by the additional delay amount (Y), and the multiplexer 705 selects one of the preliminary feedback clock FBCLK_P and an output of the delay cell 707 in response to the control signal CTRL to output the selected one as the feedback clock FBCLK.

In case of a high frequency operation, the additional delay unit 703 selects and outputs the preliminary feedback clock FBCLK_P as the feedback clock FBCLK in response to the control signal CTRL of a logic high level. On the other hand, in case of a low frequency operation, the additional delay unit 703 outputs the output of the delay cell 707 as the feedback clock FBCLK by selecting the output of the delay cell 707 in response to the control signal CTRL of a logic low level. Here, the control signal CTRL may be generated by the operational frequency detection unit 510.

Figure 8A:
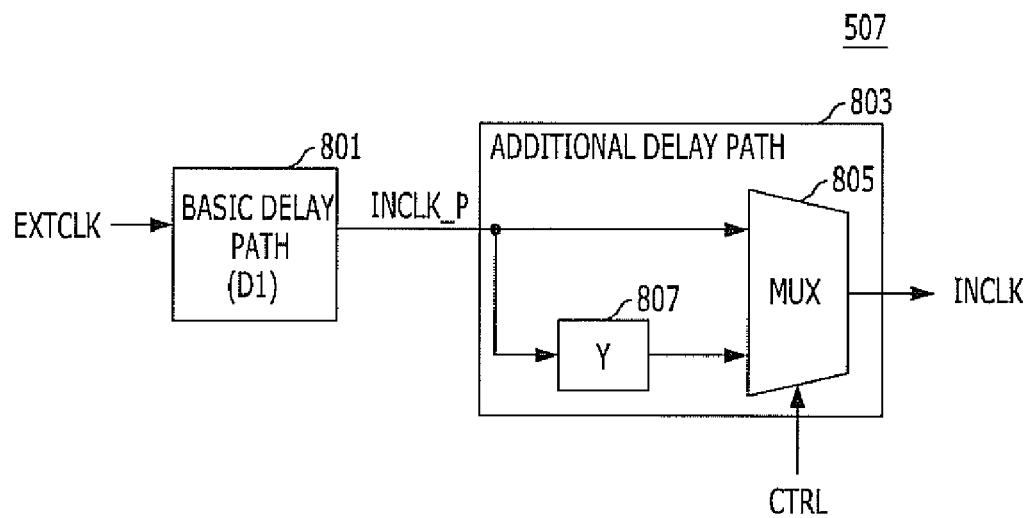
FIG. 8A is a detailed block diagram of a first clock path of FIG. 5A.

FIG. 8A is a detailed block diagram of the first clock path 507 of FIG. 5A. It shows a case where a delay amount of the first clock path 507 is increased by the additional delay amount (Y) of the replica delay unit 505 in addition to the first delay amount (D1).

Referring to FIG. 8A, the first clock path 507 comprises a basic delay path 801 and an additional delay path 803.

The delay path 801 delays the external clock EXTCLK by the first delay amount (D1) to output a preliminary input clock INCLK_P regardless of the operational frequency. The additional delay path 803 delays the preliminary input clock INCLK_P in response to the control signal CTRL and outputs the input clock INCLK.

The additional delay path 803 comprises a delay cell 807 and a multiplexer 805. The delay cell 807 delays the preliminary input clock INCLK_P by the additional delay amount (Y), and the multiplexer 805 selects one of the preliminary input clock INCLK_P and an output of the delay cell 807 in response to the control signal CTRL to output the selected one as the input clock INCLK.

In case of a high frequency operation, the additional delay path 803 selects and outputs the preliminary input clock INCLK_P as the input clock INCLK in response to the control signal CTRL of a logic high level. On the other hand, in case of a low frequency operation, the additional delay path 803 outputs the output of the delay cell 807 as the input clock INCLK by selecting the output of the delay cell 807 in response to the control signal CTRL of a logic low level. Here, the control signal CTRL may be generated by the operational frequency detection unit 510.

Figure 8B:
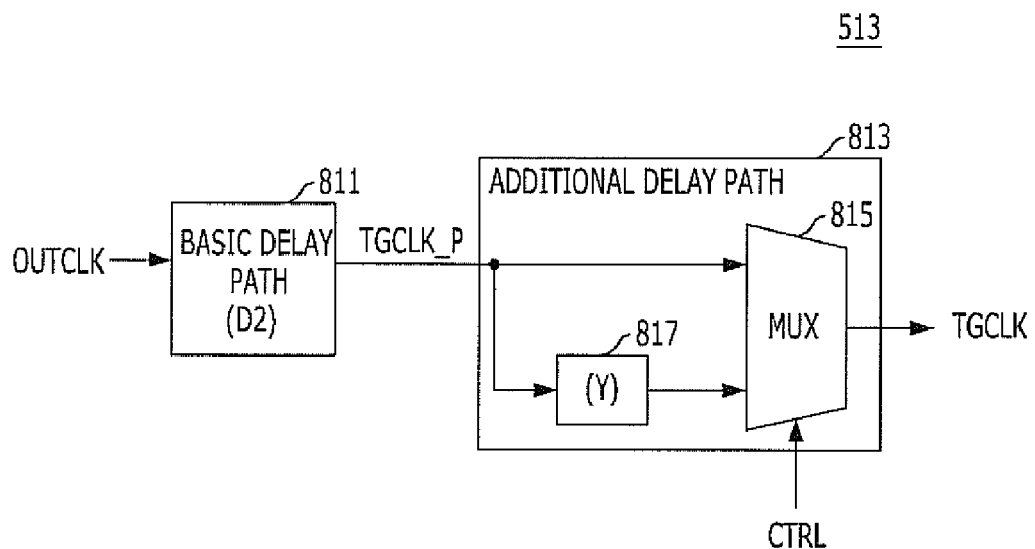
FIG. 8B is a detailed block diagram of a second clock path of FIG. 5B.

FIG. 8B is a detailed block diagram of the second clock path 513 of FIG. 5B. It shows a case where a delay amount of the second clock path 513 is increased by the additional delay amount (Y) of the replica delay unit 505 in addition to the second delay amount (D2).

Referring to FIG. 8B, the second clock path 513 comprises a basic delay path 811 and an additional delay path 813.

The delay path 811 delays the output clock OUTCLK by the second delay amount (D2) to output a preliminary target clock TGCLK_P, regardless of the operational frequency. The additional delay path 813 delays the preliminary target clock TGCLK_P in response to the control signal CTRL and outputs the target clock TGCLK.

The additional delay path 813 comprises a delay cell 817 and a multiplexer 815. The delay cell 817 delays the preliminary target clock TGCLK_P by the additional delay amount (Y), and the multiplexer 815 selects one of the preliminary target clock TGCLK_P and an output of the delay cell 817 in response to the control signal CTRL, to output the selected one as the target clock TGCLK.

In case of a high frequency operation, the additional delay path 813 selects and outputs the preliminary target clock TGCLK_P as the target clock TGCLK in response to the control signal CTRL of a logic high level. On the other hand, in case of a low frequency operation, the additional delay path 813 outputs the output of the delay cell 817 as the target clock TGCLK by selecting the output of the delay cell 807 in response to the control signal CTRL of a logic low level. Here, the control signal CTRL may be generated by the operational frequency detection unit 510.

Figure 9:
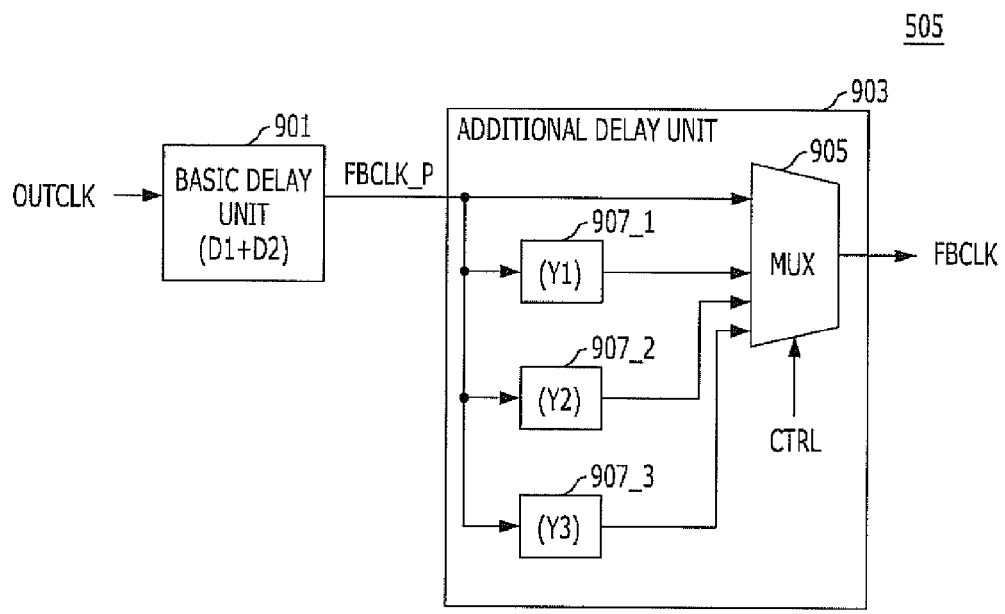
FIG. 9 is a detailed block diagram of a replica delay unit of FIG. 5A in accordance with another embodiment of the present invention.

FIG. 9 is a detailed block diagram of the replica delay unit 505 of FIG. 5A in accordance with another embodiment of the present invention.

Referring to FIG. 9, the replica delay unit 505 comprises a basic delay unit 901 and an additional delay unit 903. The delay unit 901 delays the output clock OUTCLK by the delay amount (D1+D2) to output a preliminary feedback clock FBCLK_P, regardless of the operational frequency. The additional delay unit 903 delays the preliminary feedback clock FBCLK_P in response to the control signal CTRL and outputs the feedback clock FBCLK.

The additional delay unit 903 comprises a plurality of delay cells 907_1 to 907_3 and a multiplexer 905. Each of the delay cells 907_1 to 907_3 has first to third additional delay amounts (Y1), (Y2), and (Y3), respectively, and delays the preliminary feedback clock FBCLK_P by a corresponding one of first to third additional delay amounts (Y1), (Y2), and (Y3). The multiplexer 905 selects one of the preliminary feedback clock FBCLK_P and outputs of the delay cells 907_1 to 907_3 in response to the control signal CTRL and outputs the selected one as the feedback clock FBCLK. Here, the control signal CTRL may be generated by the operational frequency detection unit 510. Preferably, the control signal CTRL is a 2-bit signal for selecting one of four paths.

In case of a high frequency operation, the additional delay unit 903 selects and outputs the preliminary feedback clock FBCLK_P as the feedback clock FBCLK in response to the control signal CTRL. On the other hand, in case of a low frequency operation, the additional delay unit 903 selects and outputs one of the outputs of the delay cells 907_1 to 907_3 as the feedback clock FBCLK in response to the control signal CTRL. Accordingly, in accordance with another embodiment, by using various additional delay amounts designated for different ranges of the operational frequency, the range of the operational frequency may be extended/divided, where for the different ranges of the operational frequency, an appropriate feedback clock FBCLK may be obtained.

Figure 10A:
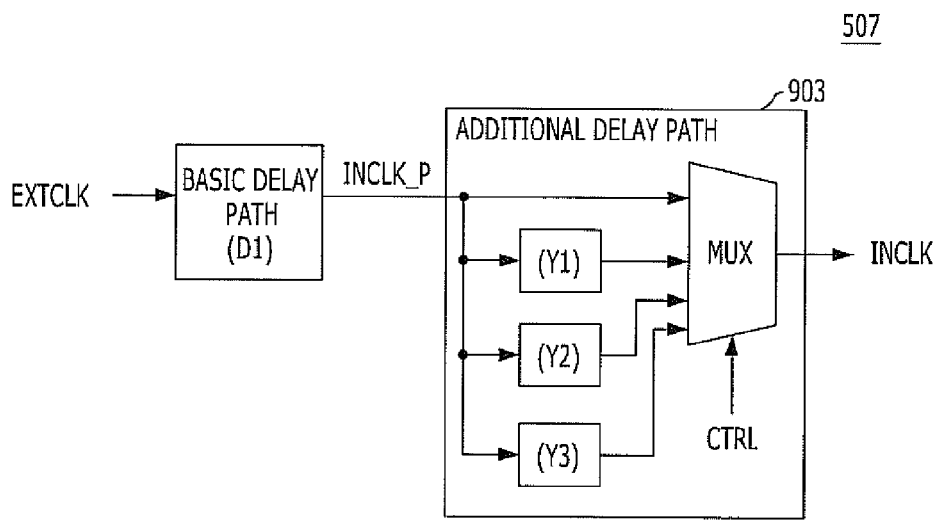
FIG. 10A is a detailed block diagram of a first clock path of FIG. 5A.
Figure 10B:
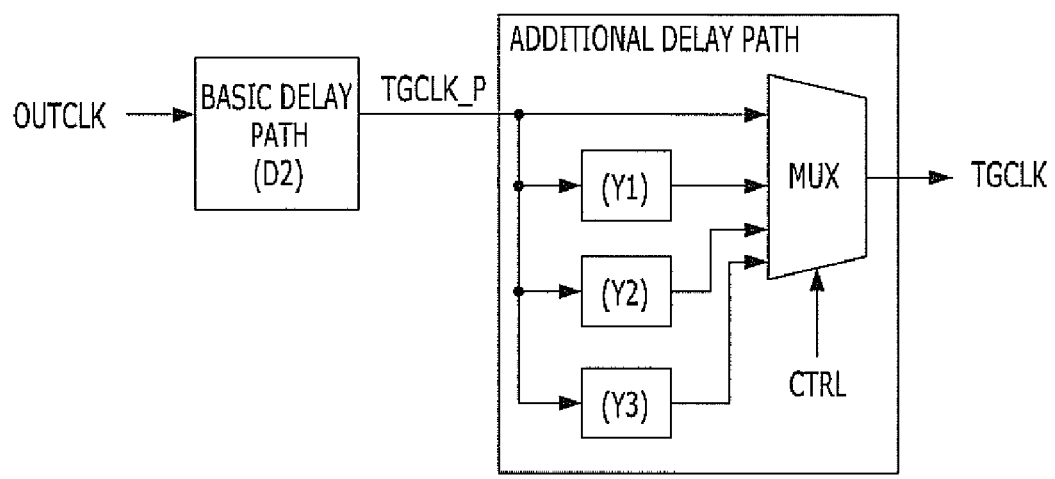
FIG. 10B is a detailed block diagram of a second clock path of FIG. 5B.

FIG. 10A is a detailed block diagram of the first clock path 507 of FIG. 5A according to another exemplary embodiment of the invention. It shows a case where a delay amount of the first clock path 507 is increased by any of the first to third additional delay amounts (Y1), (Y2), and (Y3) of the replica delay unit 505 in addition to the first delay amount (D1). FIG. 10B is a detailed block diagram of the second clock path 513 of FIG. 5B according to another exemplary embodiment of the invention. It shows a case where a delay amount of the second clock path 513 is increased by any of the first to third additional delay amounts (Y1), (Y2), and (Y3) of the replica delay unit 505 in addition to the second delay amount (D2).

As shown in FIGS. 10A and 10B, each of the first clock path 507 and the second clock path 513 may comprise a delay path and an additional delay path. In accordance with another embodiment, the additional delay path is implemented with a plurality of delay cells, each having the first and third additional delay amounts (Y1), (Y2), and (Y3), and a multiplexer which selects one of input signals having various delay amounts in response to the control signal CTRL. Here, the control signal CTRL may be generated by the operational frequency detection unit 510. Preferably, the control signal CTRL is a 2-bit signal for selecting one of four paths. Accordingly, in accordance with another embodiment, by using various additional delay amounts according to the different ranges of the operational frequency, the range of the operational frequency may be extended, and an appropriate range for the operational frequency may be selected.

In accordance with the exemplary embodiments of the present invention, an integrated circuit adjusts a delay amount of a replica delay unit of a DLL and a clock path according to a range of an operational frequency. Here, the delay amount of the replica delay unit and the clock path may be increased during a low frequency operation. Accordingly, the range of the operational frequency can be extended without increasing circuit area and current consumption.

In accordance with an exemplary embodiment of the present invention, an integrated circuit may be provided with an additional delay unit, which has various delay amounts designated for different ranges of an operational frequency besides a variable delay unit for finely controlling a delay amount. As a result, the integrated circuit may be implemented with a relative small area and may reduce jitters.

In accordance with an exemplary embodiment of the present invention, in case of an additional delay unit which is activated during a low frequency operation, resistors and capacitors of the integrated circuit may be optimized to have a desired delay amount according to a range of an operational frequency. Accordingly, an integrated circuit may be implemented with a relative small area while accommodating a large delay amount.

In accordance with an exemplary embodiment of the present invention, an integrated circuit may adjust a clock path by using a simple multiplexer, and thus the integrated circuit can prevent unnecessary current consumption.

While the present invention has been described with respect to the specific embodiments, it will be apparent to those skilled in the art that various changes and modifications may be made without departing from the spirit and scope of the invention as defined in the following claims.

What is claimed is:

1. A delay locked loop comprising:
   a first delay unit configured to output an output clock by delaying an input clock by a delay;
   a replica delay unit configured to output a feedback clock by delaying the output clock with a delay equal to a sum of a first delay amount for a first operational frequency of the delayed locked loop and an additional delay amount for a second operational frequency of the delayed locked loop, wherein the second operational frequency is lower than the first operational frequency; and
   a delay amount control unit configured to control the delay of the first delay unit by comparing a phase of the input clock with a phase of the feedback clock.

2. The delay locked loop of claim 1, wherein the replica delay unit comprises:
   a delay unit configured to delay the output clock by the first delay amount to output a preliminary feedback clock; and
   an additional delay unit configured to output the preliminary feedback clock as the feedback clock during the first frequency operation and to delay the preliminary feedback clock by the additional delay amount and output the delayed preliminary feedback clock as the feedback clock during the second frequency operation.

3. The delay locked loop of claim 2, wherein the additional delay unit is configured to adjust the additional delay amount to have different values depending on which one of a plurality of operational frequency ranges of the delay locked loop that the delay locked loop operates.

4. The delay locked loop of claim 2, wherein the additional delay unit comprises:
   a delay cell configured to delay the preliminary feedback clock by the additional delay amount; and
   a multiplexer configured to select one of the preliminary feedback clock and an output of the delay cell based on an operational frequency that the delay locked loop operates and to output the selected one as the feedback clock.

5. The delay locked loop of claim 2, wherein the additional delay unit comprises:
   a plurality of delay cells having different additional delay amounts, respectively, wherein each of the plurality of delay cells are configured to delay the preliminary feedback clock by the respective additional delay amount; and
   a multiplexer configured to select one of the preliminary feedback clock and outputs of the delay cells based on which one of a plurality of frequency ranges that the delay locked unit operates and to output the selected one as the feedback clock.

6. The delay locked loop of claim 2, wherein the first delay unit comprises a plurality of delay cells that are each configured to delay an input by a unit delay amount.

7. An integrated circuit comprising the delay locked loop of claim 1 and further comprising:
   a clock path coupled in series with the first delay unit of the delayed locked loop; and
   an operation frequency detection unit to detect an operational frequency of the delayed locked loop,
   wherein the clock path is configured to delay an input of the clock path by a delay equal to a first delay during the first high frequency operation and a sum of the first delay and the additional delay amount during the second frequency operation, and
   the first delay of the clock path is reflected in the first delay amount of the replica delay unit of the delayed locked loop.

8. The integrated circuit of claim 7, wherein an output of the clock path is received as an input of the first delay unit.

9. An integrated circuit, comprising:
   a first clock path configured to output an input clock;
   a first delay unit configured to output an output clock by delaying the input clock by a delay;
   a replica delay unit configured to output a feedback clock by delaying the output clock with a delay equal to a sum of a first delay amount during a first operational frequency of the integrated circuit and an additional delay amount during a second operational frequency of the integrated circuit, wherein the second operational frequency is lower than the first operational frequency;
   a delay amount control unit configured to control the delay of the first delay unit by comparing a phase of the input clock with a phase of the feedback clock; and
   a second clock path configured to transfer the output clock as a target clock used in a target circuit of the integrated circuit,
   wherein the first and second clock paths are configured to increase a sum of delays of the first and second clock paths by the additional delay amount during the second frequency operation.

10. The integrated circuit of claim 9, wherein the first delay amount is generated by modeling a sum of the delays in the first clock path and the second clock path.

11. The integrated circuit of claim 9, further comprising:
    an operational frequency detection unit configured to generate a control signal by detecting a range of an operational frequency of the integrated circuit.

12. The integrated circuit of claim 11, wherein the replica delay unit comprises:
    a delay unit configured to delay the output clock by the first delay amount to output a preliminary feedback clock; and
    an additional delay unit configured to output the preliminary feedback clock as the feedback clock during the first frequency operation and to delay the preliminary block by the additional delay amount and output the delayed preliminary feedback clock as the feedback clock during the second frequency operation in response to the control signal.

13. The integrated circuit of claim 11, wherein the first clock path comprises:
    a first delay path configured to delay an input of the first delay path by the by a delay reflected in the first delay amount to output a preliminary input clock; and
    an additional delay path configured to delay the preliminary input clock in response to the control signal and to output the delayed preliminary input clock as the input clock.

14. The integrated circuit of claim 13, wherein the additional delay path comprises:
    a delay cell configured to delay the preliminary input clock by the additional delay amount; and
    a multiplexer configured to select one of the preliminary input clock and an output of the delay cell in response to the control signal, and to output the selected one as the input clock.

15. The integrated circuit of claim 13, wherein the additional delay path comprises:
- a plurality of delay cells having different additional delay amounts, respectively, in delaying the preliminary input clock; and
- a multiplexer configured to select one of the preliminary input clock and outputs of the delay cells in response to the control signal, and to output the selected one as the input clock.

16. The integrated circuit of claim 11, wherein the second clock path comprises:
- a first delay path configured to delay the output clock by a delay reflected in the first delay amount in outputting a preliminary target clock; and
- an additional delay path configured to delay the preliminary target clock in response to the control signal and to output the target clock.

17. The integrated circuit of claim 16, wherein the additional delay path is further configured to output the preliminary target clock as the target clock during the first frequency operation and output the target clock by delaying the preliminary target clock by the additional delay amount during the second frequency operation.

18. The integrated circuit of claim 16, wherein the additional delay path comprises:
- a delay cell configured to delay the preliminary target clock by the additional delay amount; and
- a multiplexer configured to select one of the preliminary target clock and an output of the delay cell in response to the control signal and to output the selected one as the target clock.

19. The integrated circuit of claim 16, wherein the additional delay path comprises:
- a plurality of delay cells for delaying the preliminary target clock by different delay amounts, respectively; and
- a multiplexer configured to select one of the preliminary target clock and outputs of the delay cells in response to the control signal and to output the selected one as the target clock.

20. The integrated circuit of claim 9, wherein the delay unit comprises a plurality of delay cells that are each configured to delay an input by a unit delay amount.

* * * * *